United States Patent
Hung et al.

(10) Patent No.: US 6,642,595 B1
(45) Date of Patent: Nov. 4, 2003

(54) MAGNETIC RANDOM ACCESS MEMORY WITH LOW WRITING CURRENT

(75) Inventors: Chien-Chung Hung, Hsinchu (TW); Ming-Jer Kao, Tainan (TW)

(73) Assignee: Industrial Technology Research Institute, Chutung Hsinchu (TW)

( * ) Notice: Subject to any disclaimer, the term of this patent is extended or adjusted under 35 U.S.C. 154(b) by 0 days.

(21) Appl. No.: 10/233,524

(22) Filed: Sep. 4, 2002

(51) Int. Cl.[7] .............................................. H01L 29/82
(52) U.S. Cl. .................. 257/421; 257/422; 257/252; 257/108; 438/48; 438/54; 438/51
(58) Field of Search ................. 257/108, 252, 257/421, 422, 423, 424, 425, 426, 427; 438/48, 51, 54, 309

(56) References Cited

U.S. PATENT DOCUMENTS

| | | | | |
|---|---|---|---|---|
| 5,640,343 A | * | 6/1997 | Gallagher et al. | 365/171 |
| 5,940,319 A | * | 8/1999 | Durlam et al. | 365/171 |
| 6,331,943 B1 | * | 12/2001 | Naji et al. | 365/158 |
| 6,479,848 B2 | * | 11/2002 | Park et al. | 257/295 |
| 6,518,588 B1 | * | 2/2003 | Parkin et al. | 257/3 |
| 6,542,398 B2 | * | 4/2003 | Kang et al. | 365/97 |

* cited by examiner

*Primary Examiner*—David Nelms
*Assistant Examiner*—Andy Huynh
(74) *Attorney, Agent, or Firm*—Bacon & Thomas, PLLC

(57) ABSTRACT

A magnetic random access memory (MRAM) with a low write current, characterized in that an improved MRAM structure is composed of a plurality of conductive metal pillars disposed on both sides of a magnetic tunnel junction (MTJ) cell functioning as a memory cell. The conductive metal pillars generate a superposed magnetic field so as to reduce the write current into the MTJ cell, thereby reducing the power consumption during the operation of an MRAM. The metal pillars are formed by employing a modified mask so that a plurality of plugs are formed by via etching and metal deposition. Moreover, at least one turn of conductive metal coil is disposed near the memory cell. The enhanced magnetic field thus generated results in a lowered write current as well as reduced power consumption.

10 Claims, 8 Drawing Sheets

MAGNETIC RANDOM ACCESS MEMORY WITH LOW WRITING CURRENT

BACKGROUND OF THE INVENTION

1. Field of the Invention

The present invention generally relates to a magnetic random access memory (MRAM) and more particularly, to an MRAM with a low writingcurrent, characterized in that an improved MRAM structure is composed of a plurality of conductive metal pillars disposed on both sides of a magnetic tunnel:junction (MTJ) cell functioning as a mean of reducing the writing current.

2. Description of the Prior Art

A magnetic random access memory (MRAM) has advantages such as non-volatility, high integrity, high access speed and strong radiation resistance. When memory data is being read, a current source is provided into a selected memory cell so as to determine the digit value of the data by reading the voltage difference; however, when memory data is being written, a conventional MRAM array, as shown in FIG. 1 according to U.S. Pat. No. 5,640,343, employs two current lines (namely, a bit line 13 and a write line 11) to select a magnetic memory cell 15 by inducing a magnetic field so as to change the magnetization orientation of the material and update the data.

In the field of MRAM, it is one of the main concerns to effectively collect the magnetic flux induced by the write line 11 through a memory cell. In FIG. 2 according to U.S. Pat. No. 5,940,319, which is a schematic cross-sectional view showing a conventional magnetic memory cell circuit, a dielectric layer 21 is formed on a magnetic memory cell 15 by deposition. Then, etching is employed to form windows for a first conductor 25a connected to a bit line 13 and a second conductor 25b connected to a current controlling element 23. A high-permeability material 200 is formed on both the surface of the bit line 13 and the surface of the write line 11 excluding a surface facing magnetic memory element so as to shield and focus a magnetic field toward magnetic ,memory element. Therefore, the magnetic field through the magnetic memory cell 15 is enhanced, which results in a lowered writing current and thus reduced power consumption. The spacing between the write line 11 and the magnetic memory cell 15 can also be reduced so as to achieve the same object.

In order to enhance the magnetic field and thus lower the writing current, the present invention provides an improved MRAM structure by using a modified mask to obtain more magnetic flux induced by the infinite current lines around the magnetic memory cell 15 so as to reduce the fabrication cost.

SUMMARY OF THE INVENTION

Accordingly, it is the primary object of the present invention to provide a magnetic random access memory (MRAM) with a low write current.

In order to achieve the foregoing object, the present invention provides an MRAM with a low writing current, characterized in that an improved MRAM structure is composed of a plurality of conductive metal pillars disposed on both sides of a magnetic tunnel junction (MTJ) cell functioning as a memory cell. The conductive metal pillars generate a superposed magnetic field so as to reduce;the writing current into the MTJ cell, thereby reducing the power consumption during the operation of an MRAM. The metal pillars are formed by employing a modified layout so that a plurality of plugs are formed by via etching and metal deposition. Moreover, at least one turn of conductive metal coil is disposed near the memory cell. The enhanced magnetic field thus generated results in a lowered writing current as well as reduced power consumption.

In one preferred embodiment, the present invention provides an MRAM with a low writing current, composed of a plurality of magnetic memory elements, wherein each magnetic memory element comprising: a write line, providing said magnetic memory element with a write current channel; a bit line, providing said magnetic memory element with a write current channel and a read current channel; a magnetic memory cell, functioning as a magnetic material in said magnetic random access memory so as to change the magnetization orientation and thus the data state; a central metal via, connected to said magnetic memory cell and said bit line; and a plurality of side metal pillars, connected to said write line, so as to enhance the magnetic field through said magnetic memory cell induced by the current through said metal pillars; wherein said magnetic memory element outputs a read signal from a current controlling element.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

Figure 4:
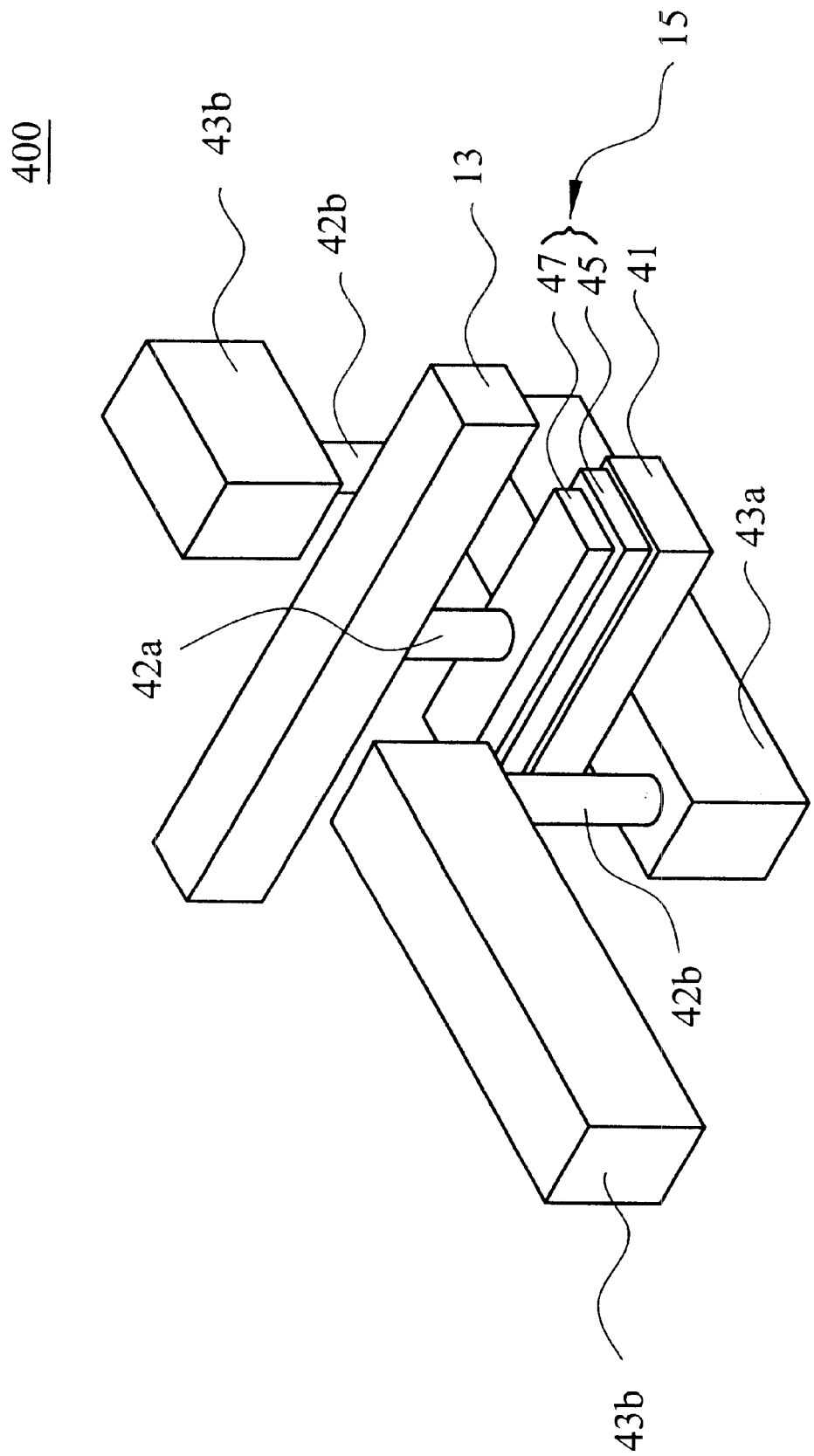
FIG. 4 is a schematic diagram showing a magnetic memory element in accordance with one preferred embodiment of the present invention.

Please refer to FIG. 4, which is a schematic diagram showing a magnetic memory element in accordance with one preferred embodiment of the present invention. The method for fabricating such a memory structure will be described hereinafter. To begin with, a current controlling element 23 for controlling a read current is fabricated on a silicon substrate. On the current controlling element 23 is formed a lower write line 43a, on which an insulating layer 41 is deposited. Lithography is then performed to open a window for a conductive seed layer 45, which employs material such as Ta, NiFe, NiFeCr, PtMn and MnIr and formed by deposition. The seed layer 45 is electrically connected to one end of the current controlling element 23 so as to provide a read current channel. Later, a magnetic tunnel junction (MTJ) cell 47 is formed by deposition and etching. After low-temperature dielectric deposition and chemical mechanical polishing (CMP), a dual damascene process as well as metal deposition is performed so as to form a plurality of metal pillars near the MTJ cell 47. As shown in FIG. 4, which is a schematic diagram showing a magnetic memory element in accordance with one preferred embodiment of the present invention, there is a central metal pillar 42a and two side metal pillars 42b. Then, a bit line 13 and upper write lines 43b are formed. The central metal pillar 42a and the side metal pillars 42b are formed together with the bit line 13 and the MTJ cell 47 by metal deposition, therefore, no additional fabrication cost is needed.

Figure 1:
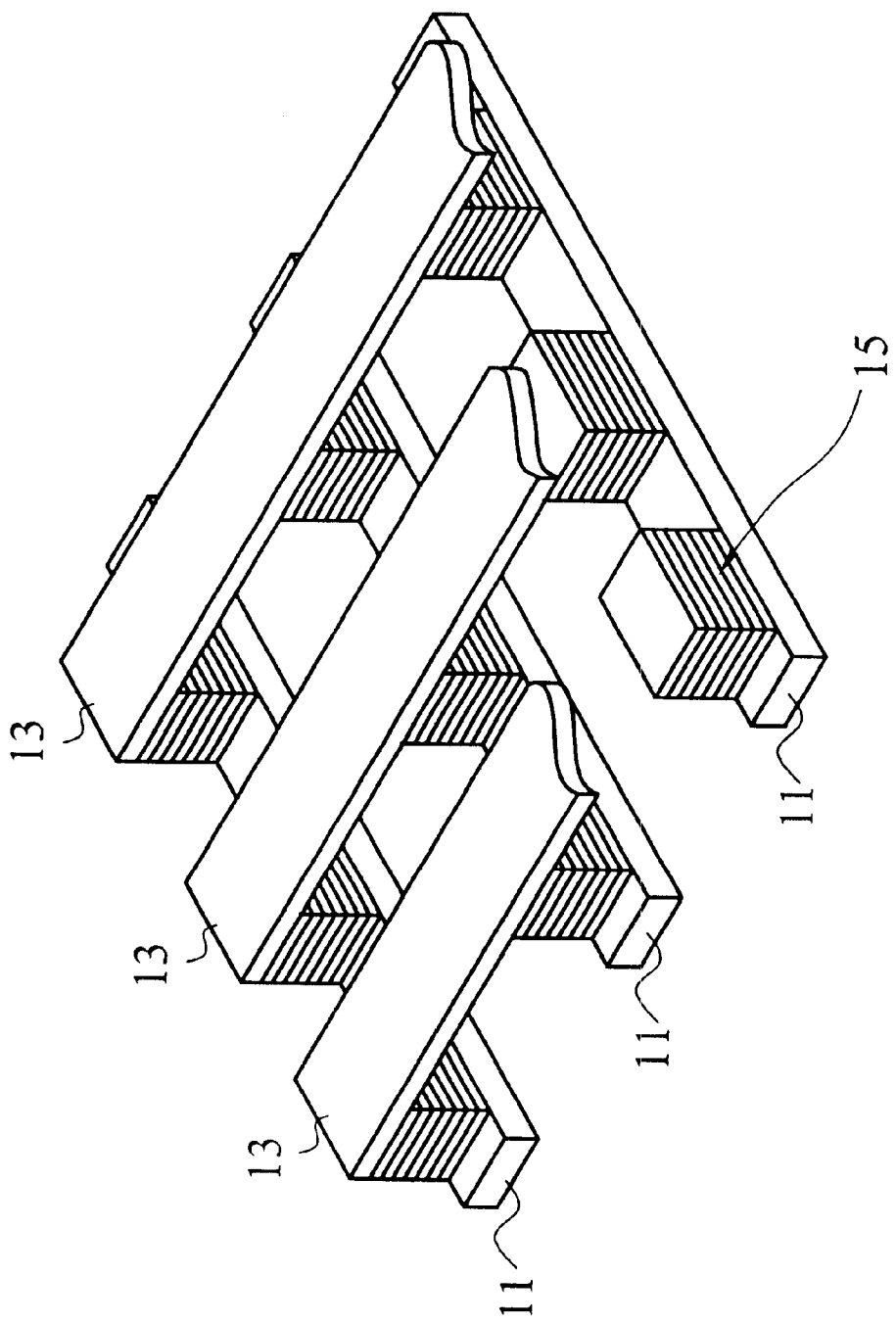
FIG. 1 is a schematic diagram showing a conventional MRAM array in accordance with the prior art.
Figure 2:
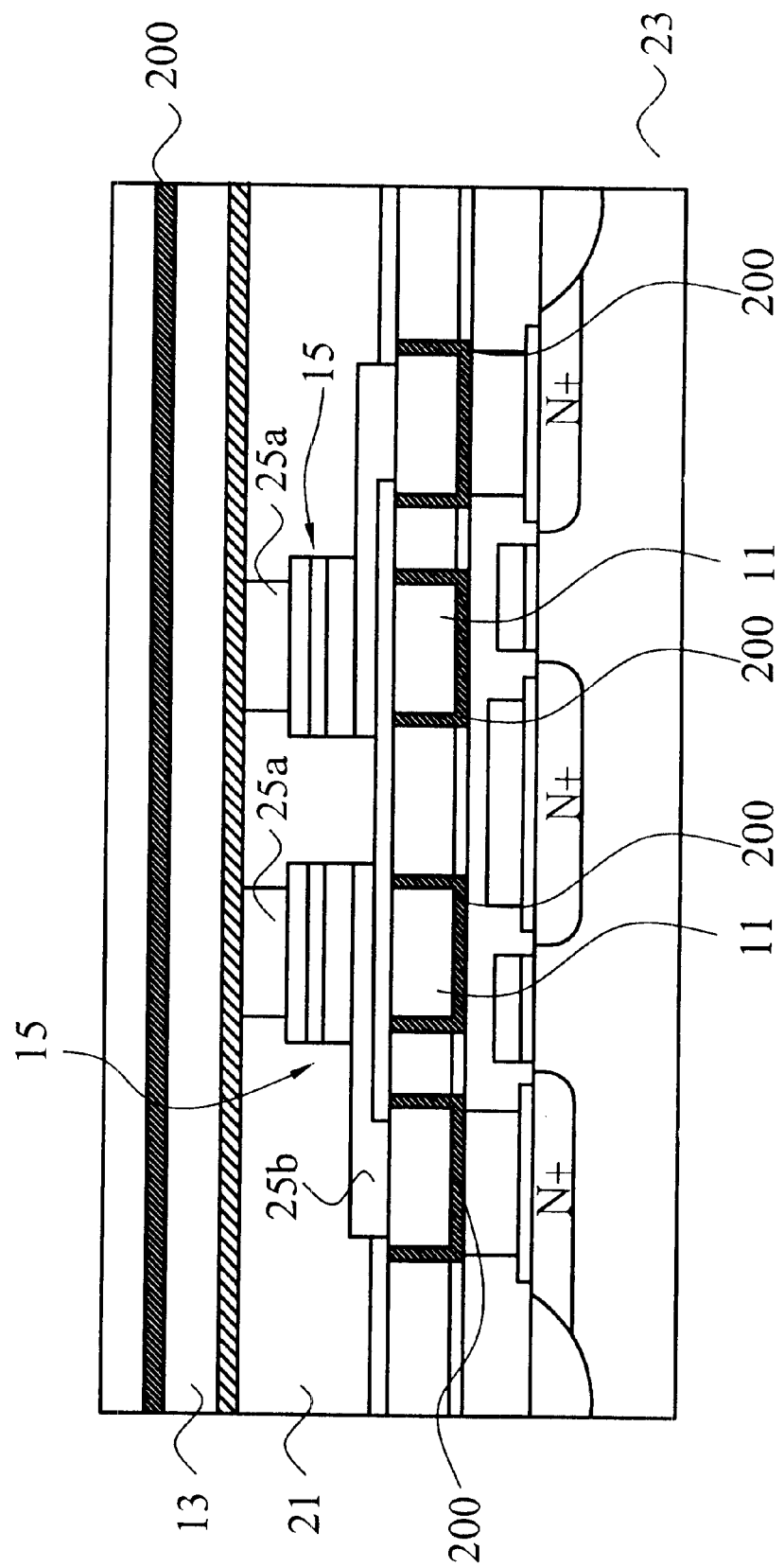
FIG. 2 is a schematic cross-sectional view showing a conventional magnetic memory element circuit in accordance with the prior art.
Figure 3:
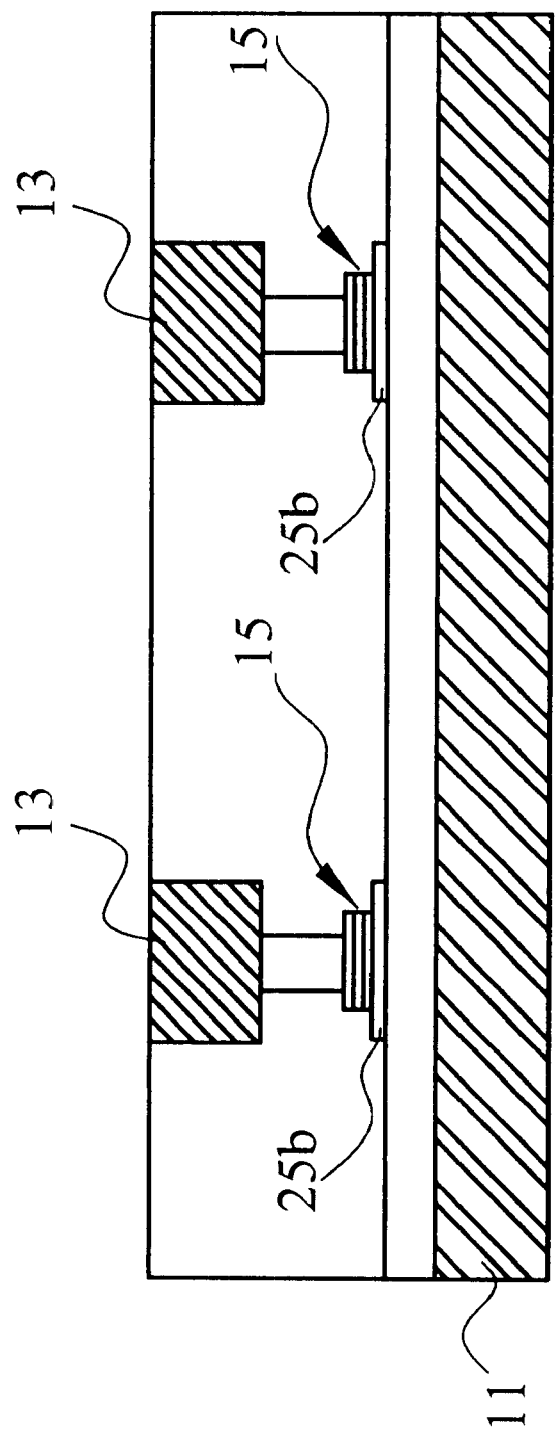
FIG. 3 is a schematic cross-sectional view showing a conventional magnetic memory element in accordance with the prior art.
Figure 5:
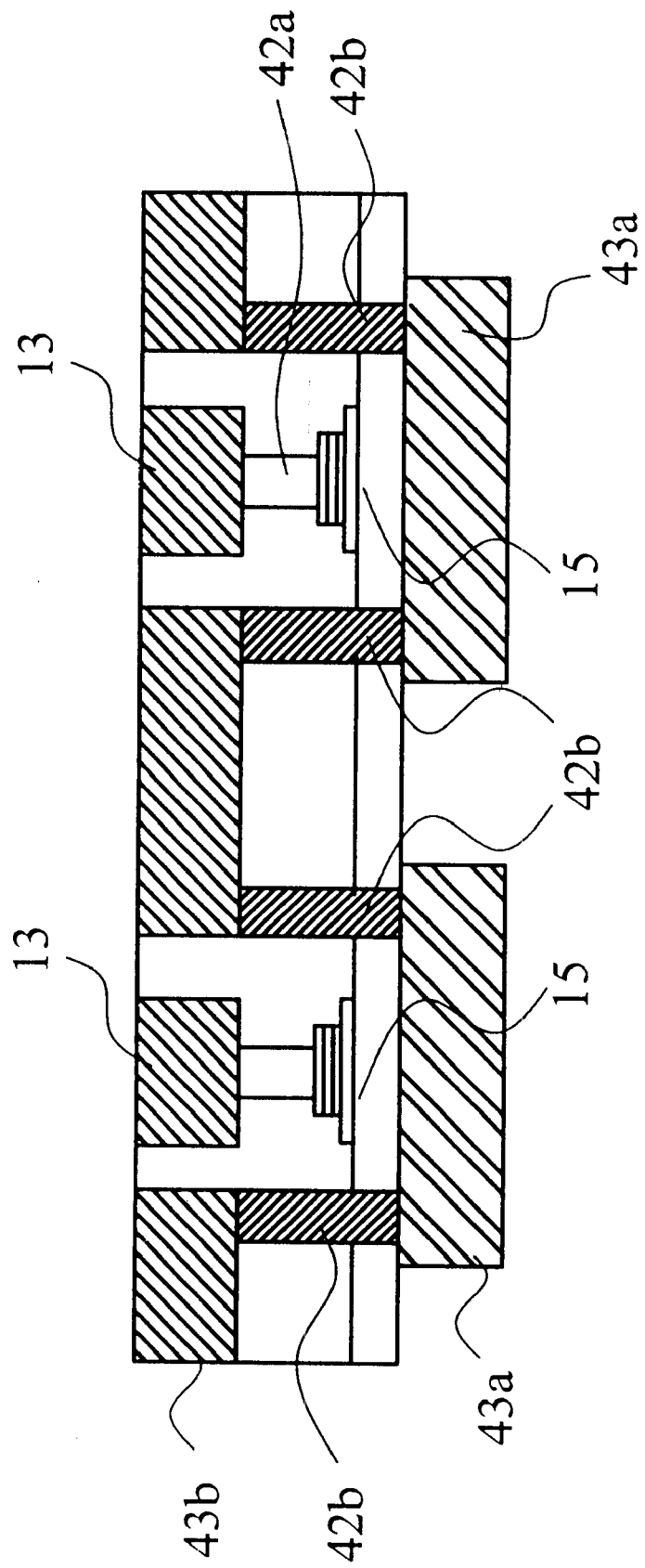
FIG. 5 is a schematic cross-sectional view a magnetic memory element in accordance with one preferred embodiment of the present invention.

Now please refer to FIG. 5, which is a schematic cross-sectional view a magnetic memory element in accordance with one preferred embodiment of the present invention. Compared to FIG. 3, a schematic cross-sectional view showing a conventional magnetic memory element in accordance with the prior art, in which a write current 11 flows from left to right. However, as shown in FIG. 5, a write current flows downwards from the upper write line 43b through the side metal pillar 42b and the lower write line 43a (from left to right), and then flows upwards through the side metal pillar 42b to the upper write line 43b, thereby surrounding a magnetic memory cell 15. From Biot-Savart's Law, we learn that the effective components of the magnetic fields induced by the three current components are in the same orientation, and each changes the date state of the magnetic memory cell 15. The sum of the magnetic fields enhances the effective magnetic field, resulting in a lowered writing current.

Figure 6:
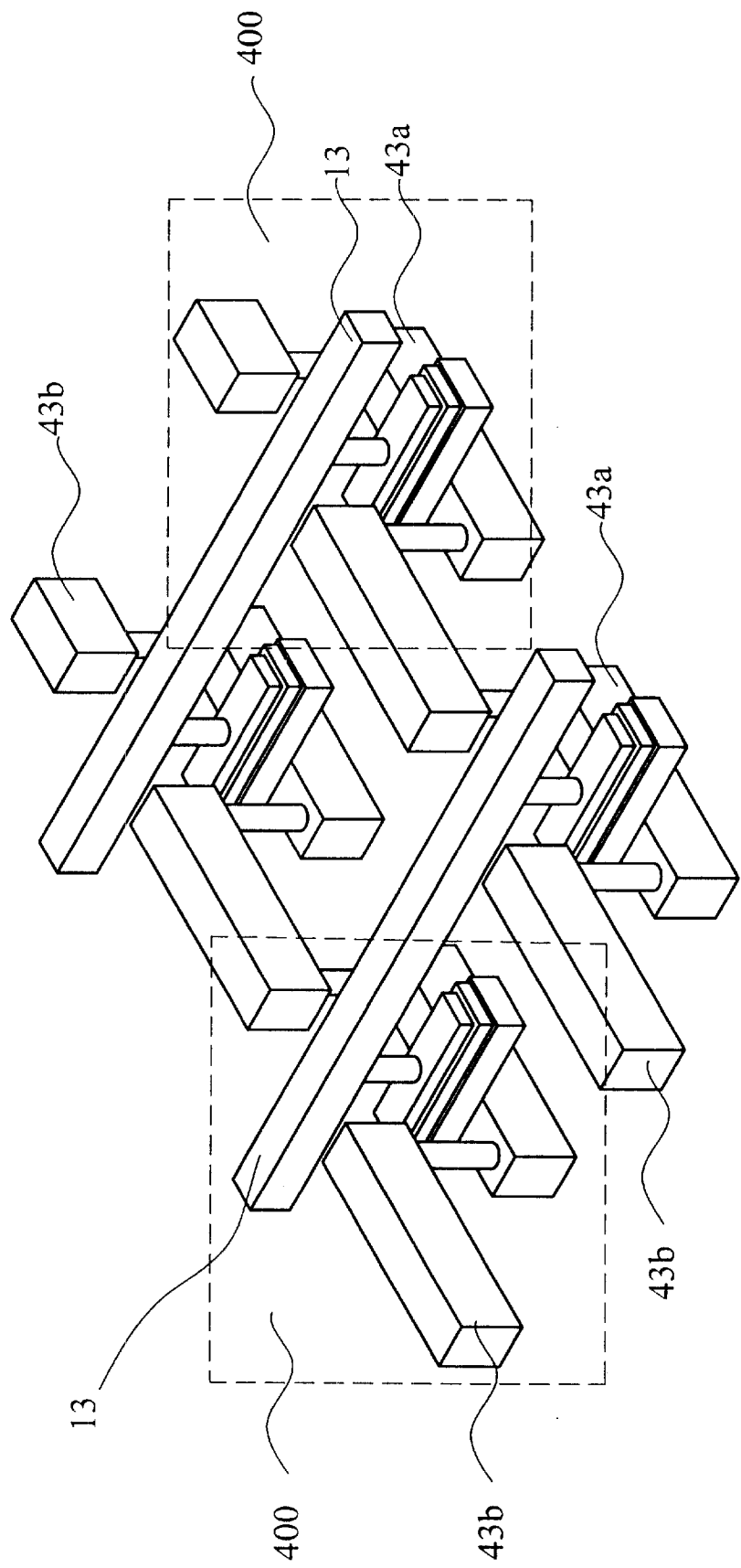
FIG. 6 is a schematic diagram showing a combination of magnetic memory elements in accordance with one preferred embodiment of the present invention.

According to Biot-Savart's Law, as shown in FIG. 5, the spacing between the side metal pillar 42b and the magnetic memory cell 15 can be reduced so as to further enhance the effective magnetic field. Please further refer to FIG. 6, a schematic diagram showing a combination of magnetic memory elements 400 in accordance with one preferred embodiment of the present invention, in which the upper write line 43b of one magnetic memory element 400 is connected to the upper write line 43b of another magnetic memory element 400, and on the other side, the bit line 13 of one magnetic memory element 400 is connected to the bit line 13 of another magnetic memory element 400. Therefore, an MRAM can be composed of four magnetic memory elements 400 as shown in FIG. 6. However, the present invention is not limited to this preferred embodiment.

Figure 7:
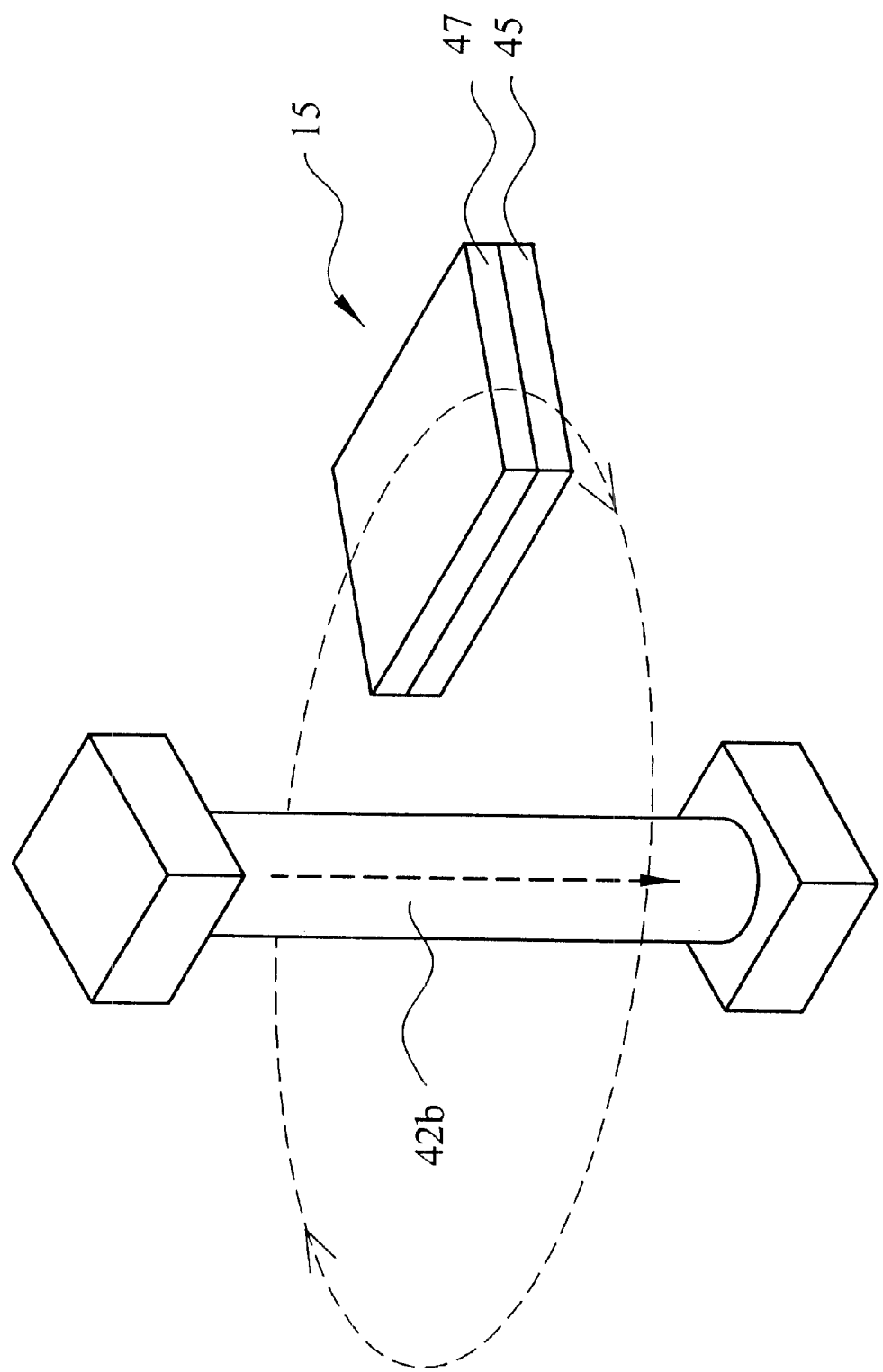
FIG. 7 is a schematic diagram showing a metal pillar and a magnetic memory cell in accordance with another preferred embodiment of the present invention.

FIG. 7 is a schematic diagram showing a metal pillar and a magnetic memory cell in accordance with another preferred embodiment of the present invention. Adjacent to the magnetic memory cell 15 composed of a conductive seed layer 45 and a MTJ cell 47 is disposed a side metal pillar 42b. When a write current flows through the side metal pillar 42b, denoted by the vertically downward dot line, an induced magnetic field is generated through the magnetic memory cell 15. The magnetic flux line is denoted by a dot line surrounding the side metal pillar 42b. The induced magnetic field applys the easy-axis field or assisted hard-axis field and changes the data state of the magnetic memory cell 15.

Figure 8:
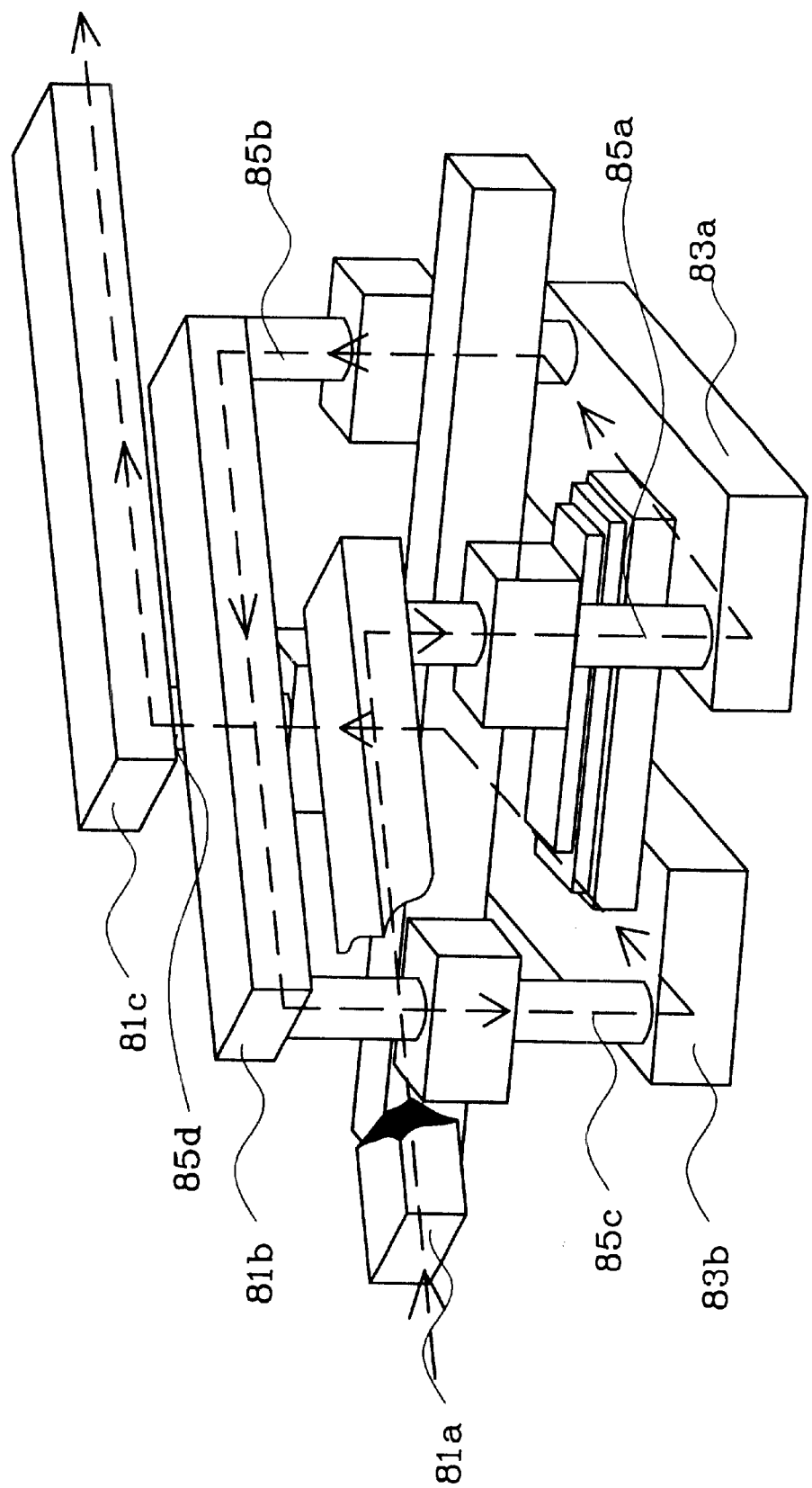
FIG. 8 is a schematic diagram showing a multiple current loop in a magnetic memory element in accordance with still another preferred embodiment of the present invention.

FIG. 8 is a schematic diagram showing a multiple current loop in a magnetic memory element in accordance with still another preferred embodiment of the present invention. The magnetic memory element 400 as shown in FIG. 4 is expanded to have a plurality of metal lines and metal pillars formed by using a modified layout so that another magnetic memory element formed with a multiple current loop surrounding a magnetic memory cell. The multiple current loop is described hereinafter, however, it is not to be restrictive of the invention. As indicated by a dot line, a current flows from one end of a first upper write line 81a to the other end of the first upper write line 81a, and then it flows downwards through a first side metal pillar 85a. Later, the current flows through a first lower write line 83a and a second side metal pillar 85b. Then, the current flows, in sequence, through a second upper write line 81b, a third side metal pillar 85c, a second lower write line 83b, a fourth side metal pillar 85d, and a third upper write line 81c. In this manner, the effective magnetic field induced by the current flowing through the plurality of writer lines and metal pillars can be enhanced so as to lower the required writing current.

According to the present invention, the plurality of side metal pillars are disposed in order to provide an enhanced induced magnetic field so that the writing current required can be lowered. From Biot-Savart's Law and Ampere's Law, the strength of the induced magnetic field according to the present invention is 2.41 times the strength of the induced magnetic field in the prior art. In other words, the required writing current can be reduced to 40%. Moreover, two turns of current loop make it possible to obtain an induced magnetic field 4.83 times that of the conventional structure, resulting in a 80% reduction of the writing current. Furthermore, the spacing between the side metal pillar 42b, and the magnetic memory cell 15 can be reduced to enhance the magnetic field. Therefore, the MRAM is further downsized.

According to the above discussion, it is apparent that the present invention discloses a magnetic random access memory (MRAM) with a low write current. Therefore, the present invention has been examined to be progressive, advantageous and applicable to the industry.

Although this invention has been disclosed and illustrated with reference to a particular embodiment, the principles involved are susceptible for use in numerous other embodiments that will be apparent to persons skilled in the art. This invention is, therefore, to be limited only as indicated by the scope of the appended claims.

What is claimed is:

1. A magnetic random access memory (MRAM) with a low write current, composed of a plurality of magnetic memory elements, each magnetic memory element comprising:

a write line, providing said magnetic memory element with a write current channel;

a bit line, providing said magnetic memory element with a writing current channel and a read current channel;

a magnetic memory cell, functioning as a magnetic material in said magnetic random access memory so as to change the magnetization orientation and thus the data state;

a central metal pillar, connected to said magnetic memory cell and said bit line; and a plurality of side metal pillars, connected to said write line, so as to enhance the magnetic field through said magnetic memory cell induced by the current through said metal pillars;

wherein said magnetic memory element outputs a read signal from a current controlling element.

2. The MRAM with a low writing current as claimed in claim 1, wherein said magnetic memory cell is composed of a seed layer and a magnetic tunnel junction (MTJ) cell functioning as a memory core.

3. The MRAM with a low writing current as claimed in claim 1, wherein said central metal pillar and plurality of side metal pillars are formed by using a dual damascene process and metal deposition.

4. The MRAM with a low writing current as claimed in claim 3, wherein said central metal pillar and plurality of side metal pillars are formed together with said bit line and the metal contact for said MTJ cell.

5. The MRAM with a low writing current as claimed in claim 1, wherein MRAM is composed of said plurality of magnetic memory elements, each magnetic memory element is formed of said write line and said bit line that are perpendicular.

6. The MRAM with a low writing current as claimed in claim 1, wherein the number of said side metal pillars is increased by using a modifiedlayout.

7. The MRAM with a low writing current as claimed in claim 1, wherein said write line includes an upper write line and a lower write line.

8. The MRAM with a low writing current as claimed in claim 6, wherein the current through said magnetic memory cell as well as the induced magnetic field is enhanced by connecting said plurality of write lines, said plurality of upper write lines, and said plurality of side metal pillars.

9. A magnetic random access memory (MRAM) with a low writing current, composed of a magnetic memory element, said magnetic memory element comprising:

a plurality of side metal pillars, providing said magnetic memory element with a current channel; and a magnetic memory cell, functioning as a magnetic material in said magnetic random access memory so as to change the magnetization orientation and thus the data state.

10. The MRAM with a low writing current as claimed in claim 9, wherein said magnetic memory cell is composed of a seed layer and a magnetic tunnel junction (MTJ) cell functioning as a memory core.

* * * * *